US011778856B2

(12) United States Patent
Polyakov et al.

(10) Patent No.: US 11,778,856 B2
(45) Date of Patent: Oct. 3, 2023

(54) ELECTRONIC DEVICE HAVING EMISSIVE DISPLAY WITH LIGHT RECYCLING

(71) Applicant: Apple Inc., Cupertino, CA (US)

(72) Inventors: Aleksandr N. Polyakov, San Jose, CA (US); Aditi G. Kanhere, Cupertino, CA (US); Brandon E. Clarke, Sunnyvale, CA (US); Cheng Chen, San Jose, CA (US); John N. Border, Campbell, CA (US); Nan Zhu, San Jose, CA (US); Rui Liu, San Jose, CA (US); Wei-Liang Hsu, Cupertino, CA (US)

(73) Assignee: Apple Inc., Cupertino, CA (US)

( * ) Notice: Subject to any disclaimer, the term of this patent is extended or adjusted under 35 U.S.C. 154(b) by 0 days.

(21) Appl. No.: 16/802,385

(22) Filed: Feb. 26, 2020

(65) Prior Publication Data

US 2020/0365831 A1     Nov. 19, 2020

Related U.S. Application Data

(60) Provisional application No. 62/848,496, filed on May 15, 2019.

(51) Int. Cl.
| | |
|---|---|
| *H01L 51/52* | (2006.01) |
| *H10K 50/856* | (2023.01) |
| *G02B 17/08* | (2006.01) |
| *H10K 50/852* | (2023.01) |
| *H10K 59/12* | (2023.01) |

(52) U.S. Cl.
CPC ....... *H10K 50/856* (2023.02); *G02B 17/0856* (2013.01); *H10K 50/852* (2023.02); *H10K 59/12* (2023.02)

(58) Field of Classification Search
CPC ............ H01L 51/5271; H01L 51/5265; G02B 17/0856
See application file for complete search history.

(56) References Cited

U.S. PATENT DOCUMENTS

| | | |
|---|---|---|
| 7,457,040 B2 | 11/2008 | Amitai |
| 7,542,209 B2 | 6/2009 | McGuire, Jr. |
| 9,798,148 B2 | 10/2017 | Border et al. |
| 10,203,762 B2 | 2/2019 | Bradski et al. |
| 2013/0278631 A1 | 10/2013 | Border et al. |
| 2013/0286053 A1 | 10/2013 | Fleck et al. |

(Continued)

FOREIGN PATENT DOCUMENTS

| | | |
|---|---|---|
| CN | 1672090 A | 9/2005 |
| CN | 1748169 A | 3/2006 |

(Continued)

*Primary Examiner* — Anthony Ho
(74) *Attorney, Agent, or Firm* — Treyz Law Group, P.C.; G. Victor Treyz; Tianyi He (57) ABSTRACT

An electronic device may have a support structure that supports a display and lenses. Each lens may be a reflective lens such as a catadioptric lens that receives polarized image light from the display and provides a corresponding image to an eye box. The display may be an emissive display with pixels that include light-emitting diodes. The light-emitting diodes may be overlapped by a light recycling layer such as a reflective polarizer or cholesteric liquid crystal layer. The light recycling layer recycles emitted light to enhance display efficiency.

24 Claims, 7 Drawing Sheets

(56) References Cited

U.S. PATENT DOCUMENTS

2015/0243097 A1    8/2015   Schowengerdt  
2018/0292713 A1*   10/2018   Drolet ............... G02F 1/133509

FOREIGN PATENT DOCUMENTS

| | | |
|---|---|---|
| CN | 101490606 A | 7/2009 |
| CN | 101681023 A | 3/2010 |
| CN | 101777289 A | 7/2010 |
| CN | 101910919 A | 12/2010 |
| CN | 102422207 A | 4/2012 |
| CN | 104115059 A | 10/2014 |
| CN | 105008986 A | 10/2015 |
| CN | 105103032 A | 11/2015 |
| CN | 105264684 A | 1/2016 |
| CN | 105829952 A | 8/2016 |
| CN | 108022959 A | 5/2018 |
| CN | 108241212 A | 7/2018 |
| CN | 108292041 A | 7/2018 |
| CN | 108535912 A | 9/2018 |
| CN | 108713159 A | 10/2018 |
| CN | 109188692 A | 1/2019 |
| WO | 2018156941 A1 | 8/2018 |

\* cited by examiner

ELECTRONIC DEVICE HAVING EMISSIVE DISPLAY WITH LIGHT RECYCLING

This application claims the benefit of provisional patent application No. 62/848,496, filed May 15, 2019, which is hereby incorporated by reference herein in its entirety.

FIELD

This relates generally to electronic devices, and, more particularly, to electronic devices with displays.

BACKGROUND

Electronic devices such as head-mounted devices may have displays. The displays may be emissive displays such as light-emitting diode displays. During operation, light-emitting diode pixels emit light to form an image for a user.

It can be challenging to form emissive displays for electronic devices such as head-mounted devices. The head-mounted devices may have reflective lenses such as catadioptric lenses that use polarized input light. Displays with pixels that emit unpolarized light can include absorptive linear polarizers to polarize the unpolarized light, but this will reduce the light emission efficiency of the display to less than 50%. Display efficiency in head-mounted devices may therefore be lower than desired.

SUMMARY

An electronic device may have support structures that support a display and lens. The support structures may be head-mounted support structures that allow the electronic device to be worn on a user's head.

The lens may be a reflective lens such as a catadioptric lens that receives polarized image light from the display and provides a corresponding image for viewing in an eye box. The display may have an absorptive linear polarizer through which emitted light passes to the catadioptric lens. The absorptive linear polarizer may help suppress light reflected from the lens.

The display may be an emissive display with pixels that include light-emitting diodes. The light emitting diodes may be organic light-emitting diodes or diodes formed from crystalline semiconductor dies. Substrates such as flexible polymer substrates and semiconductor substrates containing transistors and other circuitry for controlling the pixels may be used for supporting the pixels in the display.

The light-emitting diodes may be overlapped by a light recycling layer such as a reflective polarizer or cholesteric liquid crystal layer. The light recycling layer recycles emitted light to enhance display efficiency.

DETAILED DESCRIPTION

An electronic device may have a display. The display may present images for a user during operation of the device. In some configurations, the display may be an emissive display having pixels formed from light-emitting devices such as light-emitting diodes.

The electronic device may be a head-mounted device or other device that has optical components such as lenses. The lenses may be reflective lenses such as catadioptric lenses or other lenses that have multiply folded optical paths including polarizers or reflective polarizers and that are configured to use polarized input light.

To provide polarized light for a reflective lens, the display may be configured to emit polarized light. To enhance display efficiency, light emitted from the pixels may be recycled using light recycling structures. The light recycling structures may, for example, transmit light of a desired polarization state to the reflective lens, while simultaneously reflecting light of an opposite polarization state, where portions of the reflected light are then reflected by the display and converted to the desired polarization state by the light recycling structures and subsequently transmitted to the reflective lens.

Figure 1:
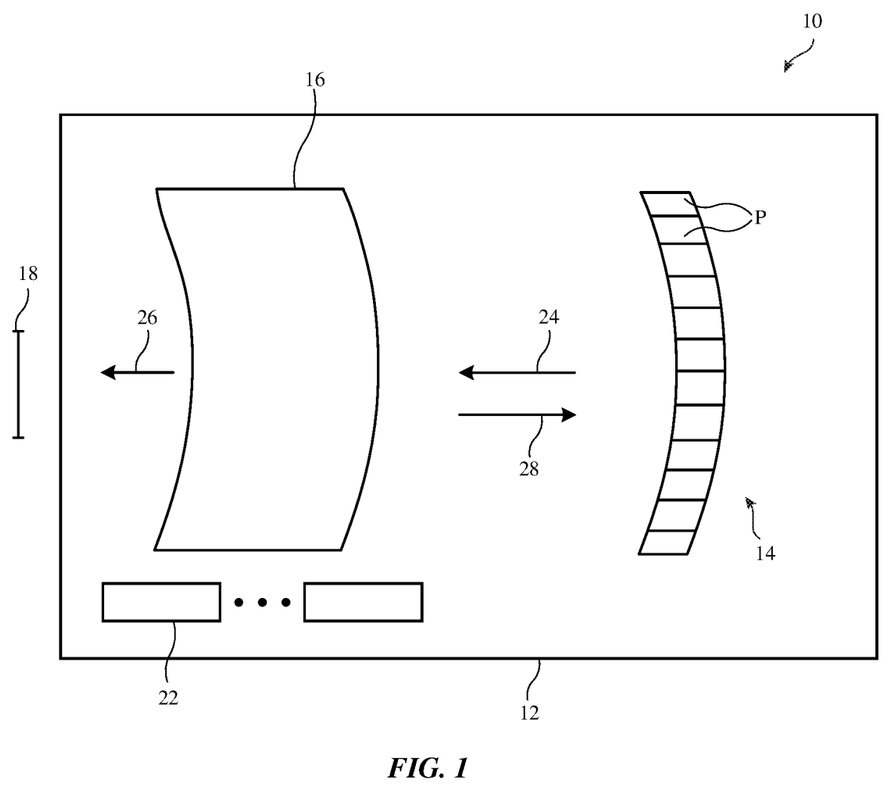
FIG. 1 is a side view of an illustrative electronic device in accordance with an embodiment.

A diagram of an illustrative electronic device with a display is shown in FIG. 1. Electronic device 10 may have a housing such as housing 12. Housing 12, which may sometimes be referred to as an enclosure or support structure, may be configured to be worn on a user's head (e.g., device 10 may be a head-mounted device and housing 12 may serve as a head-mounted support structure). In this arrangement, images from display 14 may pass through lens 16 for viewing by a user's eye located in eye box 18. There may be multiple lenses 16 and multiple sets of display pixels P for displaying images for the user's eyes (e.g., a pair of lenses 16 and a pair of pixel groups for left and right eye boxes associated with the user's left and right eyes). FIG. 1 shows a single eye box 18 to avoid over-complicating the drawing.

During operation, pixels P in device 14 (e.g., a layer of pixels in an array or other pattern) may be used to display images. Polarized image light 24 is emitted by display 14 and is received by reflective lens 16. Light 24 passes through lens 16 and is provided to eye box 18 as image light 26 so that a user may view the displayed images. Some of light 24 is reflected back towards display 14 from lens 16 as light 28. Display 14 is configured to suppress reflected light 28 to ensure that the images that are being viewed do not contain undesired stray light and ghost image artifacts.

Device 10 may be a head-mounted device such as a pair of glasses, goggles, a helmet, a head-mounted device based on a hat or headband structure, or other equipment that is worn on a user's head. Other types of electronic equipment may be used in forming electronic devices such as device 10 if desired. For example, device 10 may be a wristwatch device or other device that is worn on a portion of a user's body other than the user's head, may be a stand-alone device that rests on a desktop or that is built into a kiosk or vehicle, or may be other suitable electronic equipment. Illustrative configurations in which device 10 is a head-mounted device may sometimes be described herein as an example.

Housing 12 may be formed from polymer, metal, glass, crystalline material such as sapphire, ceramic, fabric, fibers, fiber composite material, natural materials such as wood and cotton, other materials, and/or combinations of such materials. Housing 12 may be configured to form housing walls. The housing walls may enclose an interior region within device 10 and may separate the interior region from an exterior region surrounding device 10. Housing structures for device 10 may, if desired, include head straps and other support structures that allow device 10 to be worn by a user.

Display 14 may be an emissive display that has pixels P that each are individually controlled by signals from display driver circuitry and that each emit light of a desired intensity and color in response to the control signals. Pixels P may, for example, include light-emitting devices such as light-emitting diodes. The light-emitting diodes may be thin-film light-emitting diodes such as organic light-emitting diodes and/or may be other light-emitting diodes such as light-emitting diodes formed from crystalline semiconductor dies. Display 14 may be formed from an array of pixels P on a planar substrate (e.g., display 14 may be planar) or may be formed from an array of pixels P on a substrate with a curved cross-sectional profile (e.g., display 14 may be a curved display formed from a bent flexible substrate).

Electrical components 22 may be mounted in the interior of device 10 (e.g., within an interior region of housing 12. Components 22 may include integrated circuits, discrete components, light-emitting components, sensors, and/or other circuits. Electrical components 22 may include control circuitry. The control circuitry may include storage and processing circuitry for supporting the operation of device 10. The storage and processing circuitry may include storage such as hard disk drive storage, nonvolatile memory (e.g., flash memory or other electrically-programmable-read-only memory configured to form a solid state drive), volatile memory (e.g., static or dynamic random-access-memory), etc. Processing circuitry in the control circuitry may be used to control the operation of device 10. For example, the processing circuitry may use sensors and other input-output circuitry to gather input and to provide output, to transmit signals to external equipment, to adjust display 14, and/or to perform other tasks. The processing circuitry may be based on one or more microprocessors, microcontrollers, digital signal processors, baseband processors, power management units, audio chips, application specific integrated circuits, etc. The control circuitry may include wired and/or wireless communications circuitry (e.g., antennas and associated radio-frequency transceiver circuitry such as cellular telephone communications circuitry, wireless local area network communications circuitry, etc.). The communications circuitry of the control circuitry may allow device 10 to communicate with other electronic devices. For example, the control circuitry (e.g., communications circuitry in the control circuitry) may be used to allow wired and/or wireless control commands and other communications to be conveyed between devices such as cellular telephones, tablet computers, laptop computers, desktop computers, head-mounted devices, handheld controllers, wristwatch devices, other wearable devices, keyboards, computer mice, remote controls, speakers, accessory displays, accessory cameras, and/or other electronic devices. Wireless communications circuitry may, for example, wirelessly transmit control signals and other information to external equipment in response to receiving user input or other input from sensors or other devices in components 22.

Input-output circuitry in components 22 of device 10 may be used to allow data to be supplied to device 10 and to allow data to be provided from device 10 to external devices. The input-output circuitry may include input devices that gather user input and other input and may include output devices that supply visual output, audible output, or other output.

Output may be provided using light-emitting diodes (e.g., crystalline semiconductor light-emitting diodes for status indicators and/or displays such as display 14, organic light-emitting diodes in displays and other components), lasers, and other light-emitting devices, audio output devices (e.g., tone generators and/or speakers), haptic output devices (e.g., vibrators, electromagnetic actuators, piezoelectric actuators, and/or other equipment that supplies a user with haptic output), and other output devices.

The input-output circuitry of device 10 (e.g., the input-output circuitry of components 22) may include sensors. Sensors for device 10 may include force sensors (e.g., strain gauges, capacitive force sensors, resistive force sensors, etc.), audio sensors such as microphones, touch and/or proximity sensors such as capacitive sensors (e.g., a two-dimensional capacitive touch sensor integrated into a display, a two-dimensional capacitive touch sensor and/or a two-dimensional force sensor overlapping a display, and/or a touch sensor or force sensor that forms a button, trackpad, or other input device not associated with a display), and other sensors. Touch sensors for a display or for other touch components may be based on an array of capacitive touch sensor electrodes, acoustic touch sensor structures, resistive touch components, force-based touch sensor structures, a light-based touch sensor, or other suitable touch sensor arrangements. If desired, a display may have a force sensor for gathering force input (e.g., a two-dimensional force sensor may be used in gathering force input on a display).

If desired, the sensors may include optical sensors such as optical sensors that emit and detect light, ultrasonic sensors, optical touch sensors, optical proximity sensors, and/or other touch sensors and/or proximity sensors, monochromatic and color ambient light sensors, image sensors, fingerprint sensors, temperature sensors, sensors for measuring three-dimensional non-contact gestures ("air gestures"), pressure sensors, sensors for detecting position, orientation, and/or motion (e.g., accelerometers, magnetic sensors such as compass sensors, gyroscopes, and/or inertial measurement units that contain some or all of these sensors), health sensors, radio-frequency sensors (e.g., sensors that gather position information, three-dimensional radio-frequency images, and/or other information using radar principals or other radio-frequency sensing), depth sensors (e.g., structured light sensors and/or depth sensors based on stereo imaging devices), optical sensors such as self-mixing sensors and light detection and ranging (lidar) sensors that gather time-of-flight measurements, humidity sensors, moisture sensors, gaze tracking sensors, three-dimensional sensors (e.g., time-of-flight image sensors, pairs of two-dimensional image sensors that gather three-dimensional images using binocular vision, three-dimensional structured light sensors that emit an array of infrared light beams or other structured light using arrays of lasers or other light emitters and associated optical components and that capture images of the spots created as the beams illuminate target objects, and/or other three-dimensional image sensors), facial recognition sensors based on three-dimensional image sensors, and/or other sensors.

In some configurations, components 22 may include mechanical devices for gathering input (e.g., buttons, joysticks, scrolling wheels, key pads with movable keys, keyboards with movable keys, and other devices for gathering user input). During operation, device 10 may use sensors and/or other input-output devices in components 22 to gather user input (e.g., buttons may be used to gather button press input, touch and/or force sensors overlapping displays can be used for gathering user touch screen input and/or force input, touch pads and/or force sensors may be used in gathering touch and/or force input, microphones may be used for gathering audio input, etc.). The control circuitry of device 10 can then take action based on this gathered information (e.g., by transmitting the information over a wired or wireless path to external equipment, by supplying a user with output using a haptic output device, visual output device, an audio component, or other input-output device in housing 12, etc.).

If desired, electronic device 10 may include a battery or other energy storage device, connector ports for supporting wired communications with ancillary equipment and for receiving wired power, and other circuitry. In some configurations, device 10 may serve as an accessory and/or may include a wired and/or wireless accessory (e.g., a keyboard, computer mouse, remote control, trackpad, etc.).

Lens 16 may be a catadioptric lens or other reflective lens that uses polarized input light. Lens 16 may have multiple folds in its optical path. For example, an optical path may jog sideways when passing through lens 16 or may fold back and forth as light travels along the direction of the optical axis of lens 16. Lens 16 may include optical structures with polarizing properties such as polarizers, wave plates or retarders, and reflective polarizers.

Because lens 16 is configured to receive polarized input light, display 14 is configured to produce polarized output light. To enhance light emission efficiency from display 14, display 14 may include light recycling structures. Consider, as an example, illustrative display 14 of FIG. 2. As shown in the cross-sectional side view of display 14 of FIG. 2, display 14 may include a display panel such as display panel 14P. Display panel 14P, which may sometimes be referred to as a display layer or pixels array, may have pixels (subpixels) P that emit light (i.e., display panel 14P may be an emissive display). Pixels P may include pixels of any suitable colors. For example, pixels P may include red, green, and blue pixels with red, green, and blue light-emitting diodes, respectively. Configurations in which pixels P include white light-emitting diodes (e.g., white light-emitting diodes overlapped by red, green, and blue color filters) or in which colored pixels P are overlapped by color filter elements may also be used.

Figure 2:
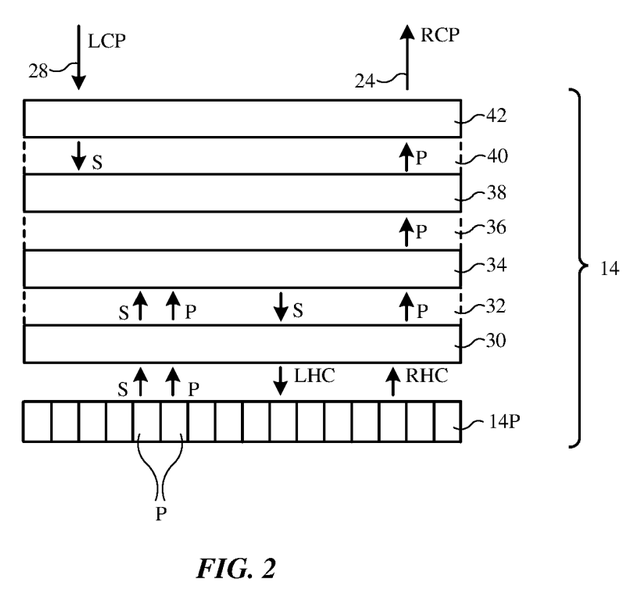
FIGS. 2 and 3 are side views of illustrative displays in accordance with embodiments.

Display panel 14P emits unpolarized light (e.g., light evenly distributed between s-polarized and p-polarized components). Wave plate 30 (e.g., a quarter wave plate) overlaps display panel 14P. Unpolarized light passing through wave plate 30 remains unpolarized (e.g., equal amounts of s-polarized and p-polarized light exit wave plate 30 when traveling outwardly from display panel 14P towards lens 16, where lens 16 would be positioned above display 14 as shown in FIG. 2).

Reflective polarizer 34 may be attached to the upper surface of wave plate 30 using optional adhesive layer 32 (e.g., a layer of pressure sensitive adhesive). Reflective polarizer 34 is configured to reflect light of a first polarization state (e.g., s-polarized light in the example of FIG. 2) and is configured to pass light of a second polarization state (e.g., p-polarized light in the example of FIG. 2, which has a linear polarization that is orthogonal to the s-polarized light). S-polarized light that is recycled by being reflected downwards by reflective polarizer 34 is converted to left-hand-circularly polarized light after passing through quarter wave plate 30. After reflecting from the surface of display panel 14P, this left-hand-circularly polarized light becomes right-hand-circularly polarized. The upwardly traveling right-hand-circularly polarized light reflecting from display panel 14P is converted to p-polarized light by quarter wave plate 30. Reflective polarizer 34 allows this p-polarized light to pass outwardly through reflective polarizer 34 to absorptive polarizer 38. By converting the S-polarized light that is reflected by the reflective polarizer 34 to P-polarized light that is transmitted by the reflective polarizer 34, the light is recycled and the efficiency of display 14 is enhanced.

Absorptive polarizer 38 may be attached to the upper surface of reflective polarizer 34 by optional adhesive 36 (e.g., pressure sensitive adhesive). Absorptive polarizer 38 is a linear polarizer. The pass axis of absorptive linear polarizer 38 may be aligned with the reflective polarizer 34 so that light transmitted by reflective polarizer 34 is also transmitted by linear polarizer 38.

A wave plate such as quarter wave plate 42 may be attached to layer 38 using optional adhesive layer 40 (e.g., pressure sensitive adhesive). Optional adhesive may also be used to attach layer 30 to panel 14P and/or to attach other layer(s) in display 14 to the layers of FIG. 2. In some configurations, layers of display 14 of FIG. 2 may be formed directly on other layers (e.g., a first layer may be formed as a coating on a second layer). As an example, a quarter wave plate may be formed as a coating on a reflective polarizer or a reflective polarizer may be formed as a coating on a quarter wave plate. The configuration of FIG. 2 is illustrative.

Quarter wave plate 42 converts the outgoing p-polarized light from polarizer 38 to right-hand-circularly polarized light. This light (see, e.g., emitted light 24 of FIG. 1) is passed to eye box 18 by lens 16. Some of emitted light 24 is reflected back from lens 16 as reflected light 28 (e.g., as left-hand-circularly polarized light). Quarter wave plate 42 converts the polarization state of reflected light 28 from left-hand-circularly polarized to s-polarized. This incoming s-polarized light is then absorbed by absorptive polarizer 38. In this way, undesired reflected light 28 from lens 16 is suppressed and does not reflect from display 14 back towards lens 16.

Figure 3:
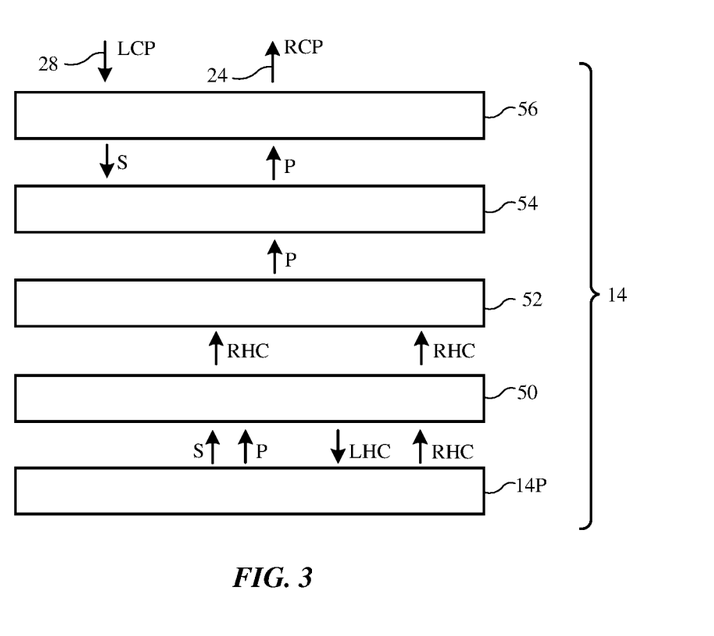

Another illustrative configuration for display 14 that includes light recycling structures is shown in FIG. 3. The layers of display 14 may be formed directly on top of each other or may be attached to each other using interposed layers of pressure sensitive adhesive or other adhesive. As shown in FIG. 3, display 14 includes display panel 14P. Pixels in display panel 14P are configured to display an image. Emitted image light may be unpolarized and may therefore contain equal amounts of s-polarized and p-polarized light. Cholesteric liquid crystal layer 50 receives unpolarized light from display panel 14P and passes right-hand-circularly polarized light to a wave plate such as quarter wave plate 52. Cholesteric liquid crystal layer 50 also reflects some of the received unpolarized light as left-hand-circularly polarized light. This recycled light is reflected from display panel 14P as right-hand-circularly polarized light and passes through cholesteric liquid crystal layer 50 as right-hand-circularly polarized light and as such it is recycled.

Quarter wave plate 52 receives the right-hand-circularly polarized light from cholesteric liquid crystal layer 50 and converts this light to p-polarized light. The p-polarized light that exits quarter wave plate 52 is passed by absorptive polarizer 54. Quarter wave plate 56 receives the p-polarized light absorptive polarizer 54 and converts this light to right-hand-circularly polarized light (emitted light 24). Emitted light 24 is passed to eye box 18 by lens 16. Some of emitted light 24 is reflected back from lens 16 as left-hand-circularly polarized reflected light 28. Quarter wave plate 56 converts the polarization state of reflected light 28 from left-hand-circularly polarized to s-polarized. The s-polarized light from quarter wave plate 56 is then absorbed by absorptive polarizer 54. Undesired reflected light 28 from lens 16 is thereby suppressed and does not reflect from display 14 back towards lens 16.

Display panel 14P may include light-emitting diodes formed in crystalline semiconductor dies or organic light-emitting diodes. Structures may be formed on display panel 14P that help prevent cross-talk between adjacent pixels. In the illustrative configuration of FIG. 4, display panel 14P has light-blocking structures 66 (sometimes referred to as cross-talk prevention structures). Structures 66 may be walls or other protruding structures formed, for example, from black ink (e.g., black photoimagable polymer). Structures 66 may have a grid shape with openings aligned with respective light-emitting diodes. Light that is emitted from a pixel may therefore be blocked by structures 66 before reaching adjacent pixels. As an example, light 60 emitted from green pixel G may reflect from surface layer 64 (e.g., a reflective polarizer). In the absence of light-blocking structures 66 (e.g., black light blocking walls between the pixels or other opaque stray light suppression structures), light 60 could reach red pixel R and could create thereby mix light between red pixel R and green pixel G (e.g., create cross-talk), thereby reducing the contrast of the display. When light blocking structures 66 are present, structures 66 prevent light from one pixel on display panel 14P being mixed with light from an adjacent pixel. In the presence of light-blocking structures 66, reflected rays of light 60 will therefore be blocked and absorbed, thereby helping to suppress cross-talk and preserve the contrast of display panel 14P.

Figure 5:
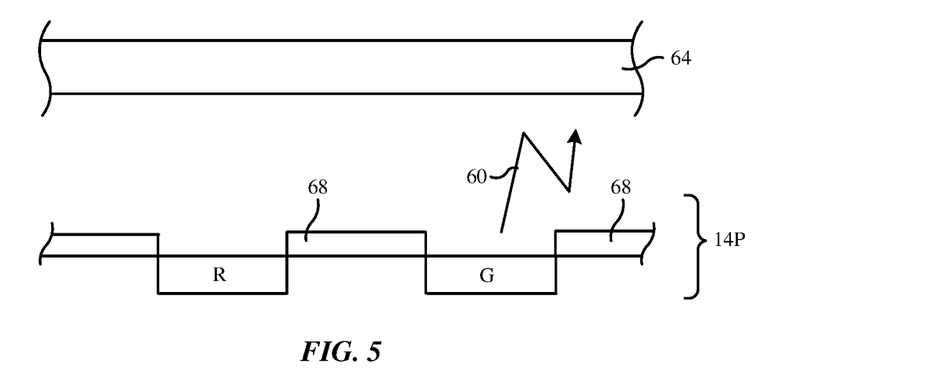
FIG. 5 is a cross-sectional side view of an illustrative display with a diffuse reflective layer such as a layer of white material that scatters and depolarizes light in accordance with an embodiment.

FIG. 5 shows how the surface of display panel 14P may be provided with white layer 68 (e.g., a coating layer of diffuse reflective material such as hazy and/or matte white ink that scatters and depolarizes light that has been reflected inwardly toward the reflective material). Organic light-emitting diode pixels supply light through openings in this white coating layer. Light 60 that is emitted from the pixels of panel 14P may reflect backwards from layer 64 as shown in FIG. 5. When this back-reflected light reaches reflective layer 68, reflective layer 68 helps reflect (e.g., scatter) the light outwardly as unpolarized light, thereby helping to recycle emitted light and improve overall light emission efficiency. In this type of arrangement, the scattered outgoing light is not polarized, so quarter wave plate 30 of FIG. 2 may be omitted.

Figure 6:
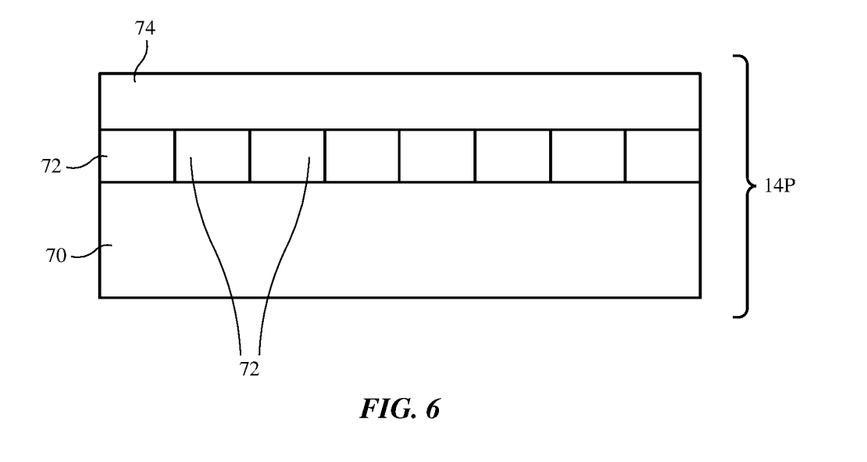
FIG. 6 is a cross-sectional side view of an illustrative display having light-emitting diode pixels on a substrate such as a flexible substrate in accordance with an embodiment.

FIG. 6 is a cross-sectional side view of display panel 14P in an illustrative arrangement in which display panel 14P has a flexible substrate. Flexible substrate 70 may, for example, be formed from a flexible polymer layer such as a sheet of polyimide or other flexible substrate material. Pixels 72 may be crystalline semiconductor dies with light-emitting diodes or may be thin-film organic light-emitting diodes on substrate 70. Display driver circuitry for pixels 72 may be formed on an integrated circuit and/or may be formed using thin-film circuitry on substrate 70. To protect pixels formed from thin-film organic light-emitting diodes, display panel 14P may be provide with encapsulation such as thin-film encapsulation layer 74. Layer 74 may include thin-film layers of inorganic and/or organic dielectric that block moisture.

Figure 7:
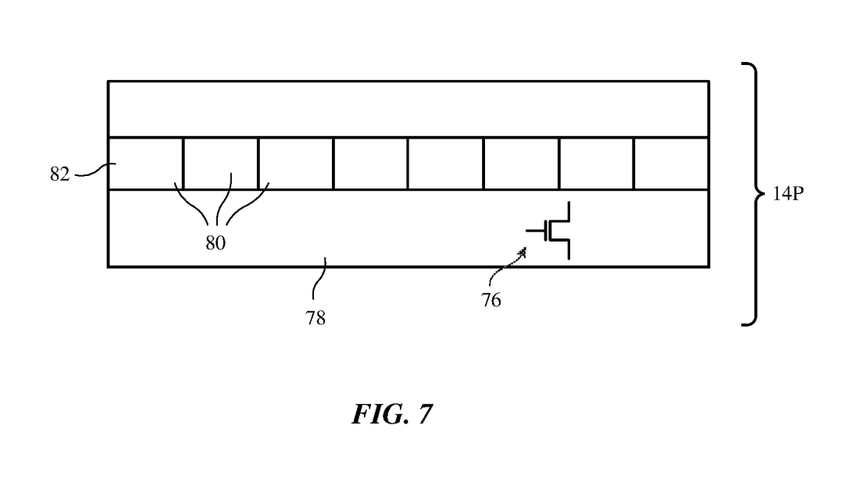
FIG. 7 is a cross-sectional side view of an illustrative display having light-emitting-diode pixels formed on a semiconductor substrate such as a silicon substrate in accordance with an embodiment.

In the example of FIG. 7, display panel 14P has a semiconductor substrate such as silicon substrate 78. Substrate 78 may include circuitry such as transistors 76 and may use this circuitry to drive pixels 80. During operation, the circuitry of substrate 78 may, for example, supply data and control signals to pixels 80 that direct pixels 80 to display images. Pixels 80 may be crystalline semiconductor dies with light-emitting diodes or may be thin-film organic light-emitting diodes formed on substrate 78. A protective layer such as layer 82 may be formed over the layer of pixels 80 on substrate 78. Layer 82 may be, for example, a cover layer formed from glass or other clear material (e.g., a layer having a thickness of at least 100 microns, 200-500 microns, less than 700 microns, or other suitable thickness).

To prevent emitted light from pixels in display panel 14P from spreading out laterally within display 14 and lowering display resolution, the light recycling materials of display 14 may be located close to the pixels in display panel 14P. For example, in a display of the type shown in FIG. 7, a reflective polarizer layer or cholesteric liquid crystal layer may be placed between pixels 80 and layer 82. In a display of the type shown in FIG. 6, the total thickness of the layers between pixels 72 and the light recycling layer may be maintained below 50 microns or other small value.

Figure 4:
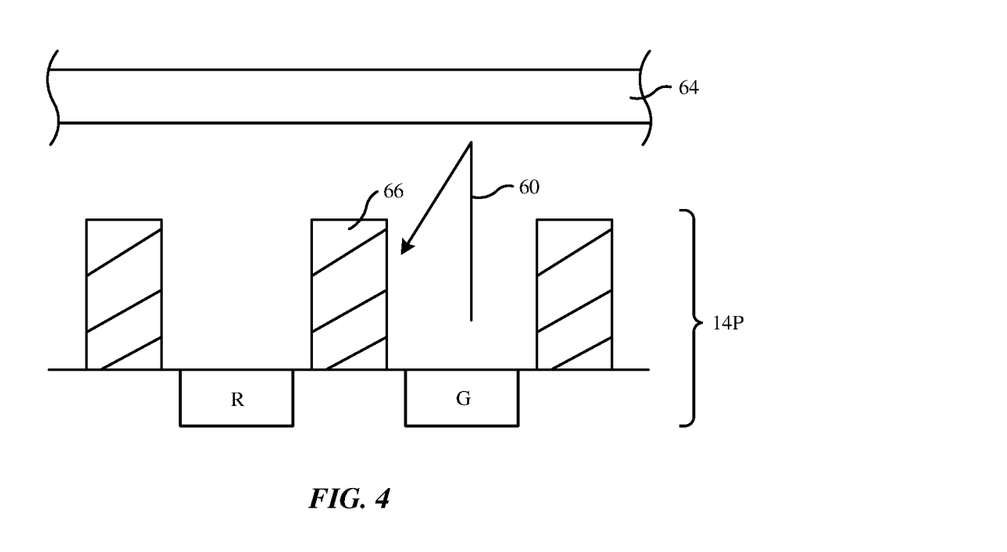
FIG. 4 is a cross-sectional side view of pixels in an illustrative display with light blocking structures that are formed between the pixels in accordance with an embodiment.
Figure 8:
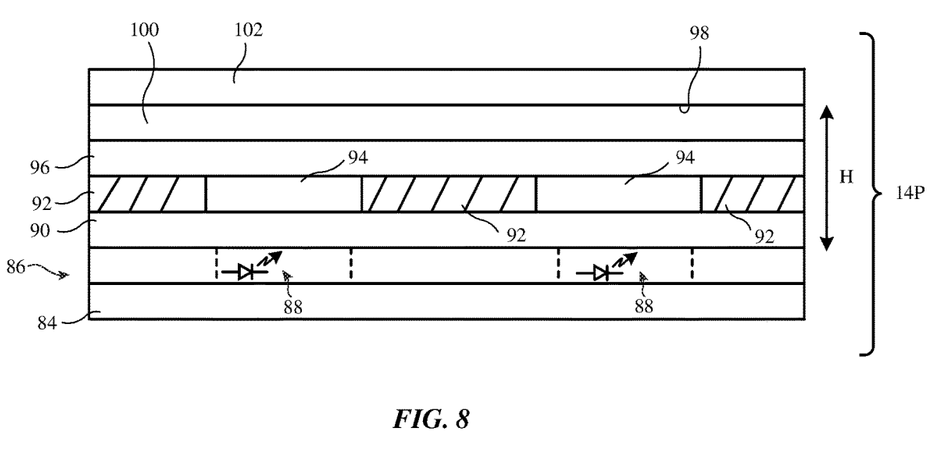
FIG. 8 is a cross-sectional side view of an illustrative display in accordance with an embodiment.

A cross-sectional side view of an illustrative display panel with light recycling structures is shown in FIG. 8. In the example of FIG. 8, display panel 14P includes pixel layer 86 on substrate 84. Pixel layer 86 includes an array of pixels 88 that each include a light-emitting diode. Layer 86 may be, for example, a thin-film circuitry layer and pixels 88 may include thin-film organic light-emitting diodes. To protect light-emitting diodes in pixels 88, layer 86 may be covered with a layer of encapsulation such as thin-film encapsulation layer 90. Layer 90 may include inorganic dielectric layers and/or polymer dielectric layers that block moisture. The thickness of layer 90 may be, for example, 5 microns, at least 1 micron, less than 25 microns, or other suitable thickness. An array of color filers (color filter elements) 94 of different colors (e.g., red, green, blue, etc.) may be formed in alignment with corresponding pixels 88 (if desired). Color filters 94 will tend to absorb (and thereby block) stray light from adjacent pixels of different colors. An opaque layer such as black matrix layer 92 (sometimes referred to as black ink, black masking layer material, or opaque masking material) may have an array of openings that receive respective color filters 94. Layer 92 may, if desired, include light blocking structures 66 (FIG. 4). The thickness of color filters 94 and black matrix layer 92 may be about 2 microns, at least 0.4 microns, less than 10 microns, or other suitable thickness. Quarter wave plate 100 may be coupled to the layer containing color filters 94 and black matrix layer 92 using adhesive 96. Adhesive 96 may be, for example, a layer of pressure sensitive adhesive having a thickness of 20 microns, at least 4 microns, less than 100 microns, or other suitable size.

Reflective polarizer 102 may be attached to quarter wave plate 100 by adhesive, reflective polarizer 102 may be formed directly on the upper surface of quarter wave plate 100 as a coating, or quarter wave plate 100 may be formed directly on the lower surface of reflective polarizer 102 as a coating (as examples). Pixels 88 may have lateral dimensions of about 4 microns, at least 1 micron, less than 25 microns, or other suitable size and may be spaced apart by a gap of 1 micron, at least 0.2 microns, less than 10 microns, or other suitable gap. To prevent undesired lateral smearing of pixel light, which could reduce contrast, the distance T between pixels 88 and lower surface 98 of the light recycling layer of panel 14P (e.g., reflective polarizer 102 in the example of FIG. 8) may be limited to a value of 28 microns, 30 microns, at least 5 microns, at least 20 microns, less than 100 microns, less than 75 microns, less than 29 microns, less than 15 microns, 10-40 microns, 20-40 microns, less than 40 microns, less than 25 microns, less than 20 microns, or other suitable value.

In the presence of light recycling structures embodiments of which have been described herein, the efficiency of light-emitting diode pixels on display panel 14P may be enhanced. Thin-film organic light-emitting diodes have reflective anodes. Emissive material for the diodes is placed on the anodes and covered with a cathode. The cathode exhibits partial reflectivity. The reflective anode and the partially reflective cathode form an optical cavity for the light-emitting diode. In the presence of a reflective polarizer or other light recycling layer (e.g., a cholesteric liquid crystal layer), the optical properties of the optical cavity are altered. During the process of designing the optical cavities for the organic light-emitting diodes, the optical properties of each of these layers (e.g., layer reflectivity, layer thickness, etc.) such as cathode layer thickness (which can affect cavity size) may be taken into account.

Figure 9:
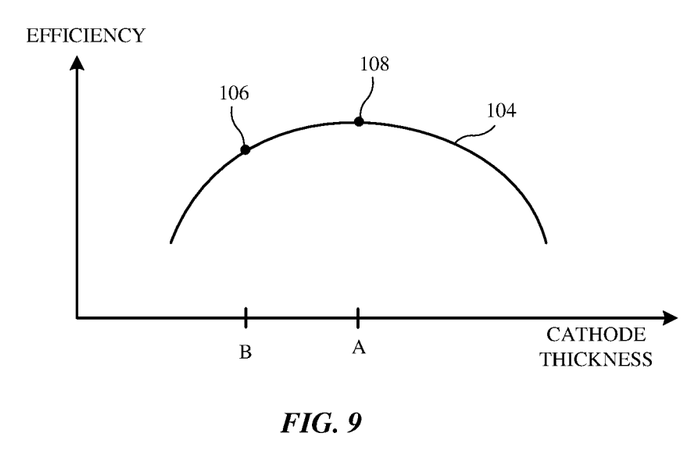
FIG. 9 is a graph showing how light-emitting diode cavity structures may be configured to enhance light emission efficiency in accordance with an embodiment.

Conventional light-emitting diode displays have cavity designs that do not maximize efficiency, but rather operate at a suboptimal operating point to enhance off-axis viewing characteristics. Curve 104 of the graph of FIG. 9 illustrates how cavity efficiency may vary as a function of cathode thickness and may peak when cathode thickness is at a particular value (e.g., thickness A in the example of FIG. 9). Conventional light-emitting diode displays are characterized by cavity thicknesses such as thickness B that result in suboptimal light emission efficiencies (see, e.g., illustrative operating point 106 for a conventional display, which is lower than the maximum possible cavity efficiency). This is done to ensure that the display has a satisfactorily wide viewing angle in comparison to displays with light-emitting diode pixels that have operating points with higher efficiency. Display panel 14P, in contrast, has light-emitting diodes that each have a cavity that includes a reflective polarizer, cholesteric liquid crystal layer, or other light recycling layer in addition to a reflective anode and partially reflective cathode. The light-emitting diodes of the pixels of display panel 14P can be configured to operate at operating point 108 of curve 104 (e.g., by using cathode thickness A). The presence of the light recycling layer in display panel 14P acts as an external cavity feature that alters the design considerations for the light emitting diodes and allows off-axis luminance to be boosted at high efficiency. As a result, panel 14P may exhibit a satisfactorily wide viewing angle while operating at a more efficient operating point than conventional displays such as operating point 108. The efficiency of display 14 in configurations in which a light recycling layer is incorporated into display 14 may be, as an example, greater than 50%, at least 55%, at least 60%, at least 70%, 50-100%, or other suitable value.

Device 10 may be operated in a system that uses personally identifiable information. It is well understood that the use of personally identifiable information should follow privacy policies and practices that are generally recognized as meeting or exceeding industry or governmental requirements for maintaining the privacy of users. In particular, personally identifiable information data should be managed and handled so as to minimize risks of unintentional or unauthorized access or use, and the nature of authorized use should be clearly indicated to users.

The foregoing is merely illustrative and various modifications can be made to the described embodiments. The foregoing embodiments may be implemented individually or in any combination.

What is claimed is:

1. An electronic device comprising:
   a support structure;
   a display supported by the support structure that has pixels configured to display an image, wherein each of the pixels includes a light-emitting device and wherein the display has a light recycling layer that overlaps the pixels; and
   a reflective lens configured to receive image light from the display and provide the image light to an eye box.

2. The electronic device defined in claim 1 wherein the light-emitting device of each pixel comprises a light-emitting diode.

3. The electronic device defined in claim 2 wherein the light recycling layer comprises a reflective polarizer.

4. The electronic device defined in claim 2 wherein the light recycling layer comprises a cholesteric liquid crystal layer.

5. The electronic device defined in claim 1 wherein the light-emitting device of each pixel comprises a thin-film organic light-emitting diode and wherein the display comprises a quarter wave plate between the light recycling layer and the pixels.

6. The electronic device defined in claim 1 wherein the display comprises an absorptive polarizer and wherein the light recycling layer is interposed between the absorptive polarizer and the pixels.

7. The electronic device defined in claim 1 wherein the display comprises light-blocking walls between the pixels.

8. The electronic device defined in claim 1 wherein the display comprises a white coating layer and wherein the pixels are in openings in the white coating layer.

9. The electronic device defined in claim 1 wherein each of the pixels has a reflective anode and a partially reflective cathode and has a cavity formed from the reflective anode, the partially reflective cathode, and a respective portion of the light recycling layer.

10. The electronic device defined in claim 1 wherein the reflective lens comprises a catadioptric lens configured to receive polarized light from the display.

11. An electronic device, comprising:
    a head-mounted support structure;
    a display supported by the head-mounted support structure, wherein the display has a substrate, light-emitting diodes on the substrate that are configured to display an image, and a light recycling layer that overlaps the light-emitting diodes; and
    a catadioptric lens supported by the head-mounted support structure that is configured to receive polarized light from the display.

12. The electronic device defined in claim 11 wherein the light recycling layer is located at a distance of less than 50 microns from pixels formed from the light-emitting diodes.

13. The electronic device defined in claim 12 wherein the display is configured to exhibit a light emission efficiency of at least 55%.

14. The electronic device defined in claim 11 wherein the substrate comprises a flexible substrate, wherein the light-emitting diodes comprises thin-film organic light-emitting diodes, wherein the display has a thin-film encapsulation layer that covers the thin-film organic light-emitting diodes, and wherein the display has a quarter wave plate between the light recycling layer and the thin-film encapsulation layer.

15. The electronic device defined in claim 14 wherein the light recycling layer comprises a reflective polarizer and wherein the display has a layer of adhesive between the quarter wave plate and pixels formed from the light-emitting diodes.

16. The electronic device defined in claim 11 wherein the light recycling layer comprises a cholesteric liquid crystal layer.

17. The electronic device defined in claim 16 wherein the display further comprises a quarter wave plate and wherein the cholesteric liquid crystal layer is between the quarter wave plate and pixels formed from the light-emitting diodes.

18. The electronic device defined in claim 11 wherein the substrate comprises a silicon substrate having transistors.

19. An electronic device, comprising:
a head-mounted support structure;
a catadioptric lens supported by the head-mounted support structure that is configured to receive polarized image light and supply a corresponding image to an eye box; and
a display supported by the head-mounted support structure that is configured to supply the polarized image light to the catadioptric lens, wherein the display comprises light-emitting diodes, a quarter wave plate, an absorptive linear polarizer between the quarter wave plate and the light-emitting diodes, and a light recycling layer between the absorptive linear polarizer and the light-emitting diodes.

20. The electronic device defined in claim 19 wherein the light recycling layer comprises a reflective polarizer and wherein the display comprises an additional quarter wave plate between the reflective polarizer and the light-emitting diodes.

21. The electronic device defined in claim 19 wherein the light recycling layer comprises a cholesteric liquid crystal layer and wherein the display comprises an additional quarter wave plate between the absorptive linear polarizer and the cholesteric liquid crystal layer.

22. An electronic device comprising:
a support structure; and
a display supported by the support structure, the display having:
pixels configured to emit light,
a light recycling layer that overlaps the pixels, and
an absorptive polarizer that overlaps the pixels, wherein at least a portion of the emitted light passes through the light recycling layer and the absorptive polarizer and wherein the absorptive polarizer is configured to receive and absorb incoming light from outside of the display.

23. The electronic device defined in claim 22, wherein the support structure comprises a head-mounted support structure, wherein the light recycling layer is interposed between the absorptive polarizer and the pixels, and wherein the absorbed light comprises polarized light.

24. An electronic device comprising:
a support structure; and
a display supported by the support structure, the display having:
pixels configured emit light, and
a light recycling layer that overlaps the pixels, wherein the light recycling layer comprises a layer that passes light of a first polarization state as display light and reflects light of a second polarization state and wherein the light recycling layer converts the reflected light of the second polarization state to light of the first polarization state for transmission as the display light.

\* \* \* \* \*